(12) United States Patent
Chen et al.

(10) Patent No.: US 8,528,999 B2
(45) Date of Patent: Sep. 10, 2013

(54) SLIDE ASSEMBLY WITH POSITIONING DEVICE

(75) Inventors: Ken-Ching Chen, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 13/225,633

(22) Filed: Sep. 6, 2011

(65) Prior Publication Data

US 2013/0058596 A1 Mar. 7, 2013

(51) Int. Cl.
*A47B 88/00* (2006.01)
*A47B 95/00* (2006.01)

(52) U.S. Cl.
USPC ..................... 312/334.45; 312/333

(58) Field of Classification Search
USPC .............. 312/333, 334.1, 334.11, 334.17, 312/334.44, 334.45, 334.46, 330.1, 334.7, 312/334.8, 334.38; 384/18, 20–22
See application file for complete search history.

(56) References Cited

U.S. PATENT DOCUMENTS

| | | | | |
|---|---|---|---|---|
| 3,650,578 A * | 3/1972 | Del Vecchio et al. | ........... | 384/18 |
| 3,904,254 A * | 9/1975 | Hagen et al. | ........... | 384/18 |
| 4,252,382 A * | 2/1981 | Thomas | ........... | 384/18 |
| 5,085,523 A * | 2/1992 | Hobbs | ........... | 384/21 |
| 6,209,979 B1 * | 4/2001 | Fall et al. | ........... | 312/330.1 |
| 6,764,151 B2 * | 7/2004 | Huang | ........... | 312/334.46 |
| 6,883,885 B2 * | 4/2005 | Judge et al. | ........... | 312/334.46 |
| 6,942,307 B1 * | 9/2005 | Lammens | ........... | 312/334.46 |
| 7,178,888 B2 | 2/2007 | Judge et al. | | |
| 7,404,611 B1 | 7/2008 | Que | | |
| 7,452,040 B1 | 11/2008 | Burgess, III | | |
| 7,571,968 B2 | 8/2009 | Ji et al. | | |
| 7,658,457 B2 | 2/2010 | Lu | | |
| 7,699,415 B2 * | 4/2010 | Tseng et al. | ........... | 312/333 |
| 7,780,252 B2 | 8/2010 | Mushan et al. | | |
| 7,794,030 B2 | 9/2010 | Peng et al. | | |
| 7,794,031 B2 | 9/2010 | Hsiung et al. | | |
| 7,850,369 B2 * | 12/2010 | Young et al. | ........... | 384/18 |
| 7,878,607 B2 * | 2/2011 | Huang et al. | ........... | 312/334.46 |
| 7,980,641 B2 | 7/2011 | Huang et al. | | |
| 2006/0163983 A1 * | 7/2006 | Wu | ........... | 312/333 |
| 2007/0127856 A1 * | 6/2007 | Young et al. | ........... | 384/18 |
| 2012/0106880 A1 * | 5/2012 | Chen et al. | ........... | 384/49 |
| 2012/0153792 A1 * | 6/2012 | Yu et al. | ........... | 312/333 |

FOREIGN PATENT DOCUMENTS

JP 3176462 U * 6/2012

* cited by examiner

*Primary Examiner* — Janet M Wilkens
*Assistant Examiner* — Andrew Roersma
(74) *Attorney, Agent, or Firm* — Rosenberg, Klein & Lee

(57) ABSTRACT

The slide assembly includes a first rail, a second rail, a bearing assembly and an engaging member. The first rail includes an opening located adjacent to an end thereof and a stop face is defined on a wall of the opening. The bearing assembly is located between the first and second rails. The bearing assembly has a bearing retainer which has a first contact portion. The engaging member is connected to the second rail and has a second contact portion and an engaging portion. The second contact portion is located corresponding to the first contact portion. When the second rail is pulled relative to the first rail, the bearing retainer is moved by engagement between the first and second contact portions. When the bearing assembly moves to a desired position, the engaging portion is inserted into the opening and contacts the stop face so that the second rail is engaged with the first rail.

8 Claims, 8 Drawing Sheets

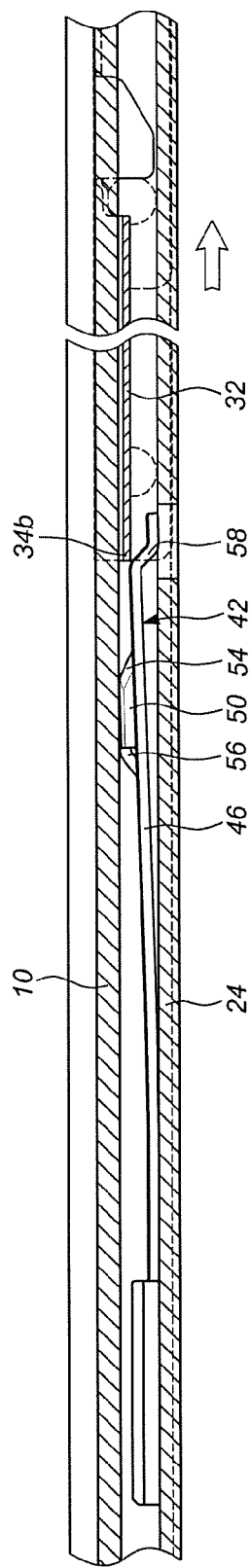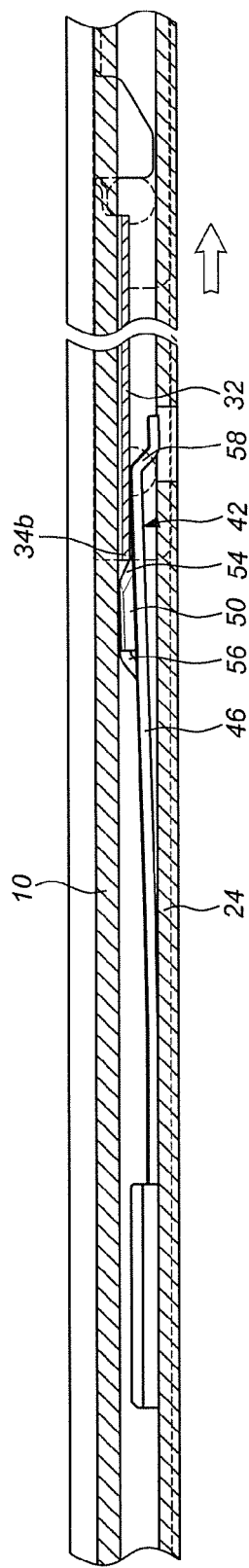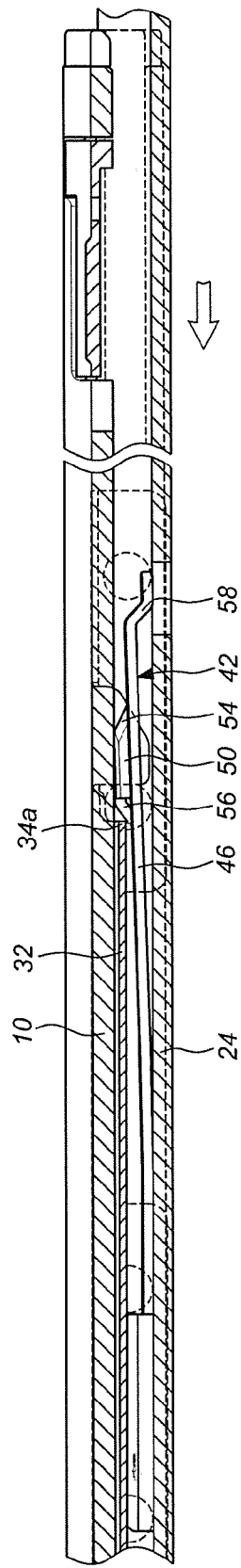

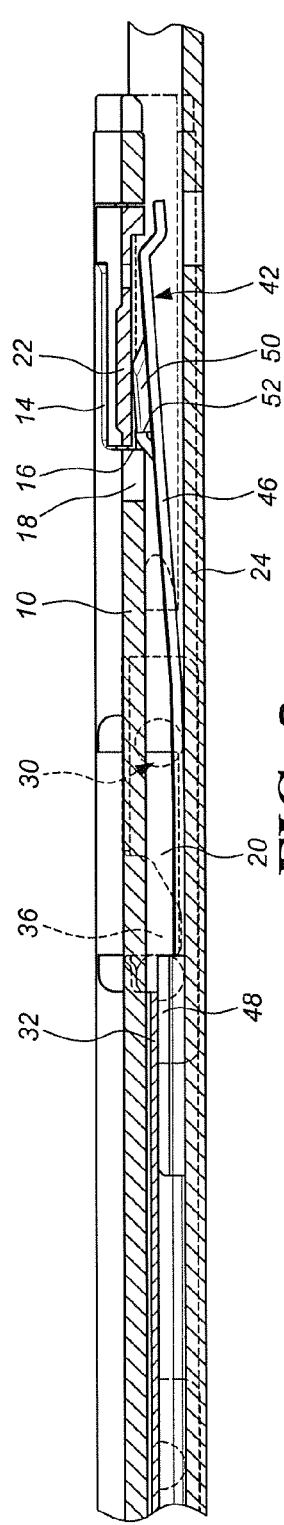
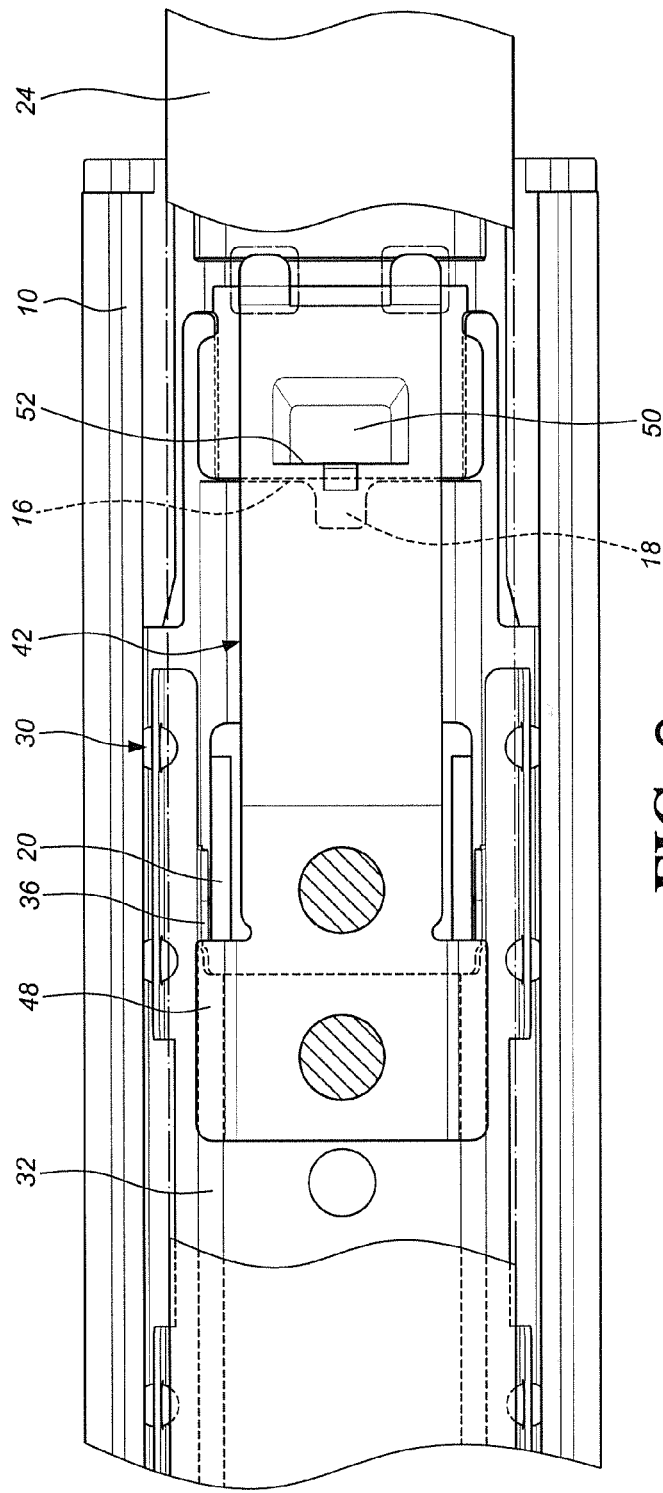

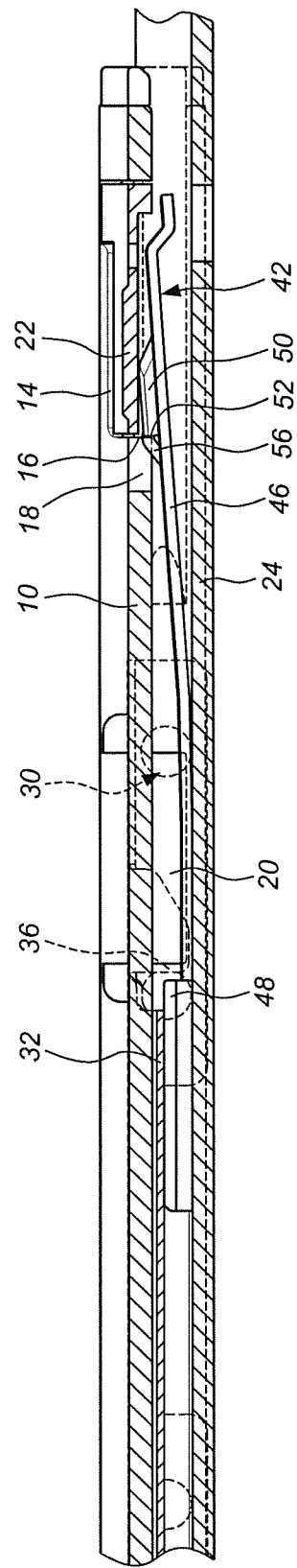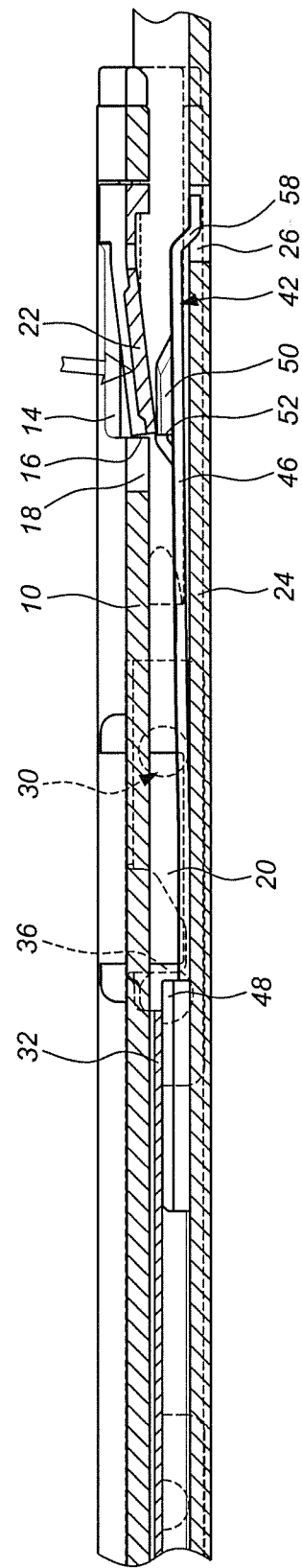

SLIDE ASSEMBLY WITH POSITIONING DEVICE

FIELD OF THE INVENTION

The present invention relates to a slide assembly with a positioning device, and more particularly, to a bearing assembly which is moved to a pre-set position by an engaging member when the second rail is pulled out relative to the first rail, and the second rail is engaged with the first rail.

BACKGROUND OF THE INVENTION

The conventional rails are used to the drawers of furniture or the chassis on the computer rack so as to support the slide of the drawer or the chassis. Generally, the bearing assembly includes a plurality of bearings which allow the rails to be easily pulled relative to another. However, when the rails are pulled to a distance, the portions of the rails that are not overlapped to each other cannot retain the bearings therein, so that the conventional bearing assembly has a bearing retainer to retain the bearings. The bearing retainer separates the bearings so that the bearings are not in contact with each other.

The bearing assembly provides the sliding action between the rails and must include a stop base to avoid the bearing assembly from dropping from the rails. Therefore, the rails have a stop base to stop the bearing assembly and the front end of the rails is used to support the inner rail that is pulled out from the outer rail.

As for the minimum distance and the maximum distance between the two rails to be retracted or expanded, the two-section rails and the bearing assembly are free to slide. When retracting the rails, the rails are pushed to the very end and the bearing assembly is always located between the rails. However, when the rails are pulled to the extreme expanding position, the bearing assembly is shifted by the friction of the inner rail so that it may not move to the desired position. In other words, the bearing assembly does not move to the maximum distance with the inner rail, the bearing assembly is stopped by the stop base when it moves to the maximum distance. When the rails are retracted at the status that the bearing assembly does not move to the maximum distance, the bearing assembly will return to its retraction position where the inner rail that not yet reach the desired position will contact the bearings. This makes the movement not smooth as expected. Besides, if the bearing assembly is not moved to the desired position, the connection of exterior equipment to the inner rail is affected.

Furthermore, for the inner rail detachable slide assembly, the inner rail is able to be pulled out from the bearing assembly and separated from the stop base. When the inner rail is to be inserted into the slide assembly and engaged with the bearing assembly from the position where the stop base is located, the bearing assembly has to be in contact with the stop base, such that the inner rail is guided by the stop base to precisely engage with the bearing assembly.

In addition, for the conventional slide assembly, in order to prevent the inner rail from being dropping and retracted when the inner rail is pulled, there is an engaging mechanism located between the inner rail and the stop base. Nevertheless, the engaging mechanism and the movement of the bearing assembly are related to each other. However, under the consideration of reducing manufacturing cost and reducing the number of parts, the above-mentioned mechanism is needed to be improved.

The present invention intends to provide a positioning device that improves the inherent shortcoming which is that the bearing assembly is not moved to the desired position when the inner rail is pulled.

SUMMARY OF THE INVENTION

The primary object of the present invention is to provide a positioning device for a slide assembly, when the second rail is pulled relative to the first rail, the second rail and the bearing assembly are moved relative to the first rail, and the engaging member on the second rail drives the bearing assembly to continuously move to the desired position. The engaging member makes the second rail be engaged with the first rail.

The present invention relates to a slide assembly and comprises a first rail which includes a path defined along the longitudinal direction of the first rail. An opening is located adjacent to an end of the first rail and a stop face is defined on a wall of the opening. A second rail is movably located in the path of the first rail and extendable through the end with the opening. A bearing assembly is located between the first and second rails. The bearing assembly has a bearing retainer which has a first contact portion. A stop base is located between the first and second rails. The stop base is located adjacent to the opening of the first rail and corresponding to the bearing assembly. An engaging member has a fixing portion, a resilient portion, a second contact portion and an engaging portion, wherein the fixing portion is fixed to the second rail. The resilient portion extends longitudinally from the fixing portion and is bent an angle relative to the fixing portion. The second contact portion extends transversely from the fixing portion and is located corresponding to the first contact portion of the bearing retainer. The engaging portion extends from the resilient portion and moves toward the first rail by the resilient portion.

When the second rail is pulled relative to the first rail, the bearing retainer is moved with the second rail by engagement between the first contact portion and the second contact portion. When the second rail moves to a desired position relative to the first rail, the engaging portion of the engaging member contacts the stop face of the first rail.

Preferably, the first rail has a stop wall located adjacent to the opening, so that when the second rail is moved to a desired position relative to the first rail, the second contact portion of the engaging member contacts the stop wall of the first rail.

Preferably, the engaging portion of the engaging member protrudes toward the first rail and includes a contact end and a first inclined guiding portion. The contact end faces the fixing portion and the first inclined guiding portion is located opposite to the contact end. A second inclined guiding portion extends from the contact end and reaches the resilient portion. The stop face of the first rail has a recess which communicates with the opening and the second inclined guiding portion is inserted into the recess.

Preferably, the engaging member has a third inclined guiding portion which extends from the resilient portion and bends toward the second rail.

Preferably, the second rail has a through hole which is located corresponding to the third inclined guiding portion.

Preferably, a pressing member is engaged with the opening of the first rail. The pressing member is pushed to contact the engaging member so as to move the engaging portion away from the stop face of the first rail.

Preferably, the pressing member is connected to the stop base.

Preferably, the pressing member has two wings which contact an inside wall of the opening.

The present invention provides another embodiment of the slide assembly and comprises a first rail including a path defined along the longitudinal direction of the first rail. An opening is located adjacent to an end of the first rail and a stop wall is located adjacent to the opening. A second rail is movably located in the path of the first rail and extendable through the end with the opening. A stop base is located between the first and second rails. The stop base is located adjacent to the opening of the first rail and corresponding to the bearing assembly. A bearing assembly is located between the first and second rails. The bearing assembly has a bearing retainer which has a first contact portion. An engaging member has a fixing portion and a second contact portion, wherein the fixing portion is fixed to the second rail. The second contact portion extends transversely from the fixing portion and is located corresponding to the first contact portion of the bearing retainer. When the second rail is pulled relative to the first rail, the bearing retainer contacts the second contact portion of the engaging member by the first contact portion. When the second rail moves to a desired position, the second contact portion of the engaging member contacts the stop wall of the first rail. The first contact portion of the bearing retainer moves to the stop wall.

The present invention will become more obvious from the following description when taken in connection with the accompanying drawings which show, for purposes of illustration only, a preferred embodiment in accordance with the present invention.

BRIEF DESCRIPTION OF THE DRAWINGS

FIG. 3 shows that when the second rail is pulled relative to the first rail, the third inclined guiding portion of the engaging member slides and contacts the second end of the bearing retainer;

FIG. 4 shows that when the second rail is further pulled relative to the first rail, the first inclined guiding portion of the engaging member slides and contacts the second end of the bearing retainer;

FIG. 5 shows that when the second rail is retracted relative to the first rail, the second inclined guiding portion of the engaging member slides and contacts the first end of the bearing retainer;

FIG. 8 shows the top view of the relationship of the engaging member and the first rail when the second rail is pulled to a desired position relative to the first rail;

FIG. 9 shows the side view of the relationship of the engaging member and the first rail when the second rail is pulled to a desired position relative to the first rail;

FIG. 10 shows that when the second rail is pulled to a desired position relative to the first rail and then the second rail is retracted a small distance, the contact end of the engaging member contacts the stop face of the first rail;

FIG. 11 shows that the contact end of the engaging member is disengaged from the stop face of the first rail.

DETAILED DESCRIPTION OF THE PREFERRED EMBODIMENT

Figure 1:
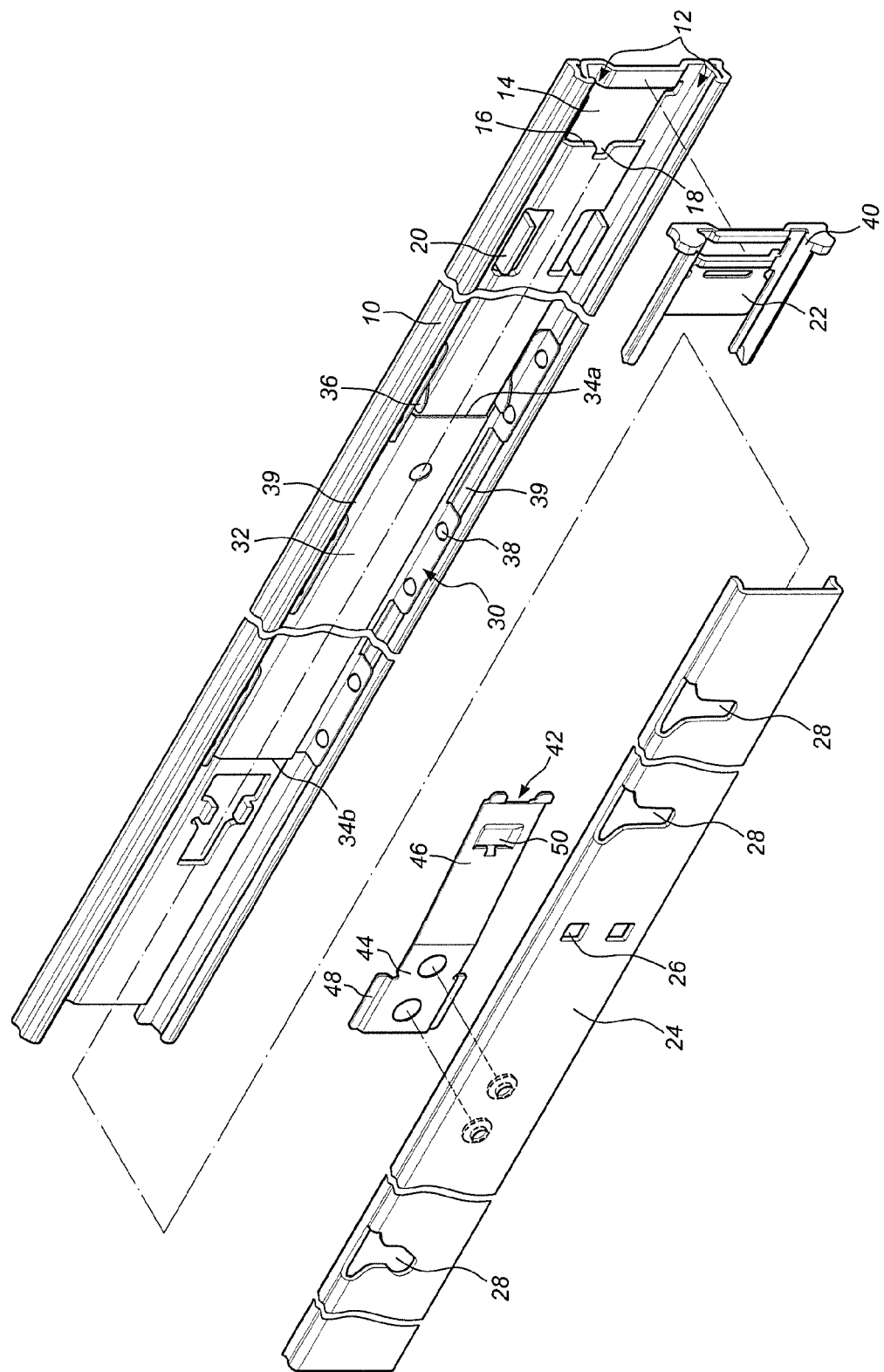
FIG. 1 is an exploded view to show the slide assembly of the present invention.
Figure 2:
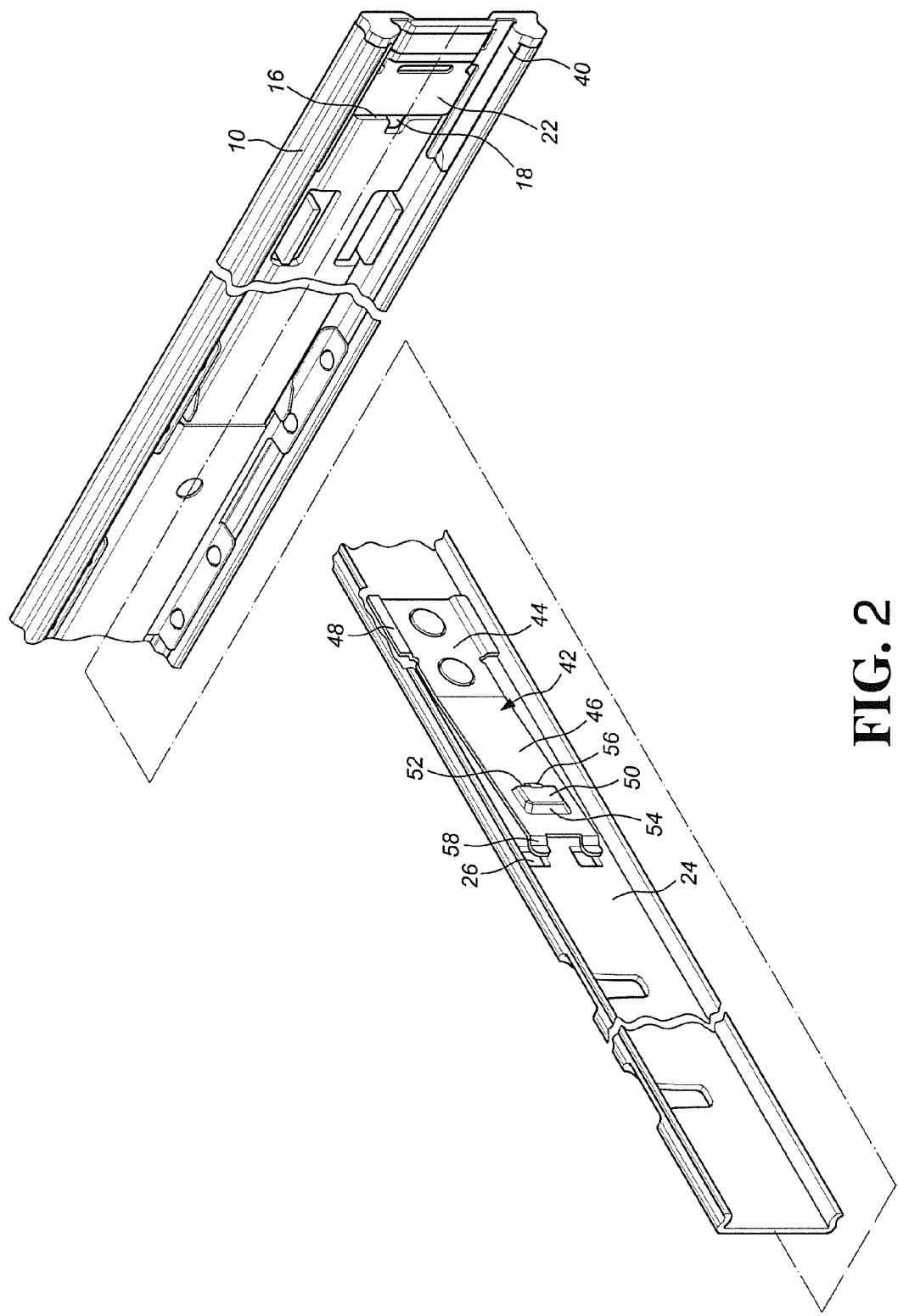
FIG. 2 shows the relationship of the first and second rails of the slide assembly of the present invention.

Referring to FIGS. 1 and 2, the slide assembly of the present invention comprises a first rail 10, a pressing member 22, a second rail 24, a bearing assembly 30, a stop base 40 and an engaging member 42.

The first rail 10 includes a path 12 defined along the longitudinal direction of the first rail 10 and an opening 14 is located adjacent to an end of the first rail 10. A stop face 16 is defined on a wall of the opening 14. The stop face 16 of the first rail 10 has a recess 18 which communicates with the opening 14 and a stop wall 20 is located adjacent to the opening 14.

The pressing member 22 is engaged with the opening 14 of the first rail 10.

The second rail 24 is movably located in the path 12 of the first rail 10 and may extend through the end with the opening 14. The second rail 24 has at least one through hole 26, and multiple installation holes 28 are located along the length of the second rail 24. The installation holes 28 are connected with an exterior object such as posts of a chassis (not shown).

The bearing assembly 30 is located between the first and second rails 10, 24, and the bearing assembly 30 has a bearing retainer 32 which has a first end 34a, a second end 34b, a first contact portion 36 and multiple bearings 38. The second end 34b is located corresponding to the first end 34a. The bearings 38 make the second rail 24 slide easily relative to the first rail 10. Preferably, the bearing retainer 32 includes multiple equally spaced notches 39.

The stop base 40 is located between the first and second rails 10, 24, and the stop base 40 is located adjacent to the opening 14 of the first rail 10 and corresponding to the bearing assembly 30. When the second rail 24 is pulled to a pre-set position relative to the first rail 10, the bearing retainer 32 of the bearing assembly 30 contacts the stop base 40.

The engaging member 42 has a fixing portion 44, a resilient portion 46, a second contact portion 48 and an engaging portion 50. The fixing portion 44 is fixed to the second rail 24. The resilient portion 46 extends longitudinally from the fixing portion 44 and is bent an angle relative to the fixing portion 44. The second contact portion 48 extends transversely from the fixing portion 44 and is located corresponding to the first contact portion 36 of the bearing retainer 32. The engaging portion 50 extends from the resilient portion 46 and protrudes toward the first rail 10. The protruding engaging portion 50 has a contact end 52 extending toward the fixing portion 44. The engaging portion 50 moves toward the first rail 10 by the force of the resilient portion 46.

In this embodiment, the engaging member 42 has a first inclined guiding portion 54, a second inclined guiding portion 56 and a third inclined guiding portion 58. The first inclined guiding portion 54 is located opposite to the contact end 52 and the second inclined guiding portion 56 extends from the contact end 52 and reaches the resilient portion 46. The third inclined guiding portion 58 extends from the resilient portion 46 and bends toward the second rail 24. The through hole 26 is located corresponding to the third inclined guiding portion 58. By the first, second and third inclined guiding portions 54, 56, 58, when the engaging member 42 slides and contacts the first rail 10 and about to pass the first end 34a of the bearing retainer 32 or the second end 34b of the bearing retainer 32, as shown in FIGS. 3 to 5, the first, second and third inclined guiding portions 54, 56, 58 can slide over the ends 34a, 34b of the bearing retainer 32. The ends of the engaging member 42 and the engaging portion 50 are not stopped by the bearing retainer 32, so that the second rail 24 can be smoothly moved relative to the first rail 10.

Figure 6:
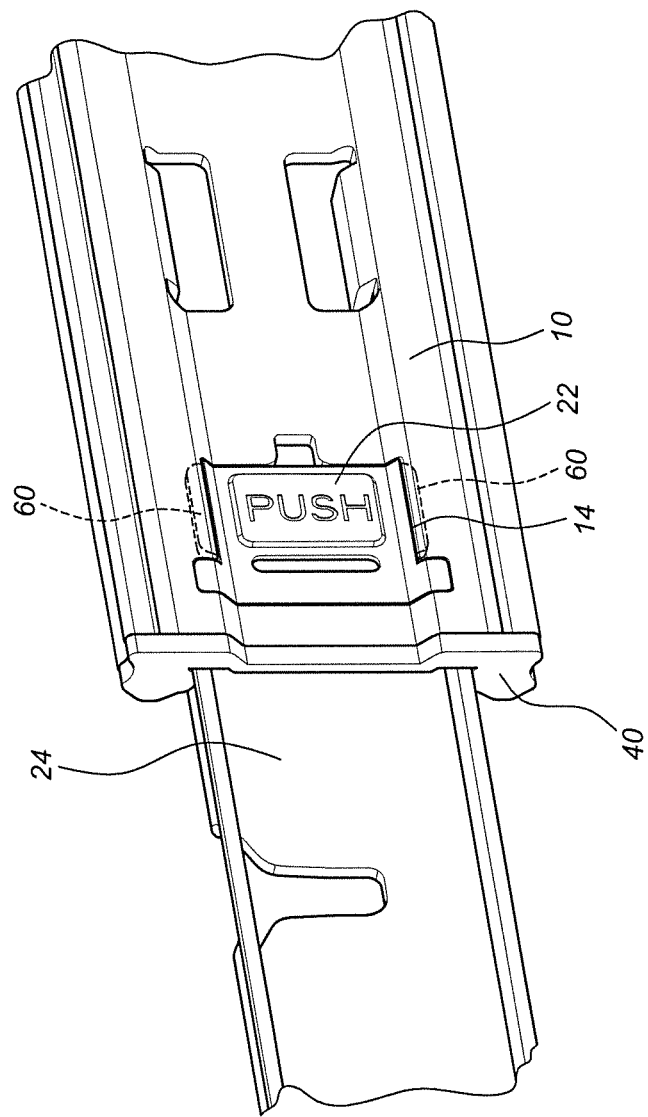
FIG. 6 shows that the pressing member includes two wings which contact an inside wall of the opening of the first rail.

The pressing member 22 is preferably connected to the stop base 40 and located corresponding to the opening 14 of the first rail 10. The pressing member 22 has two wings 60 which contact an inside wall of the opening 14 as shown in FIG. 6. Therefore, the pressing member 22 can only be moved in one direction relative to the opening 14. In this embodiment, when the pressing member 22 is pressed, it can only move toward the second rail 24.

Figure 7:
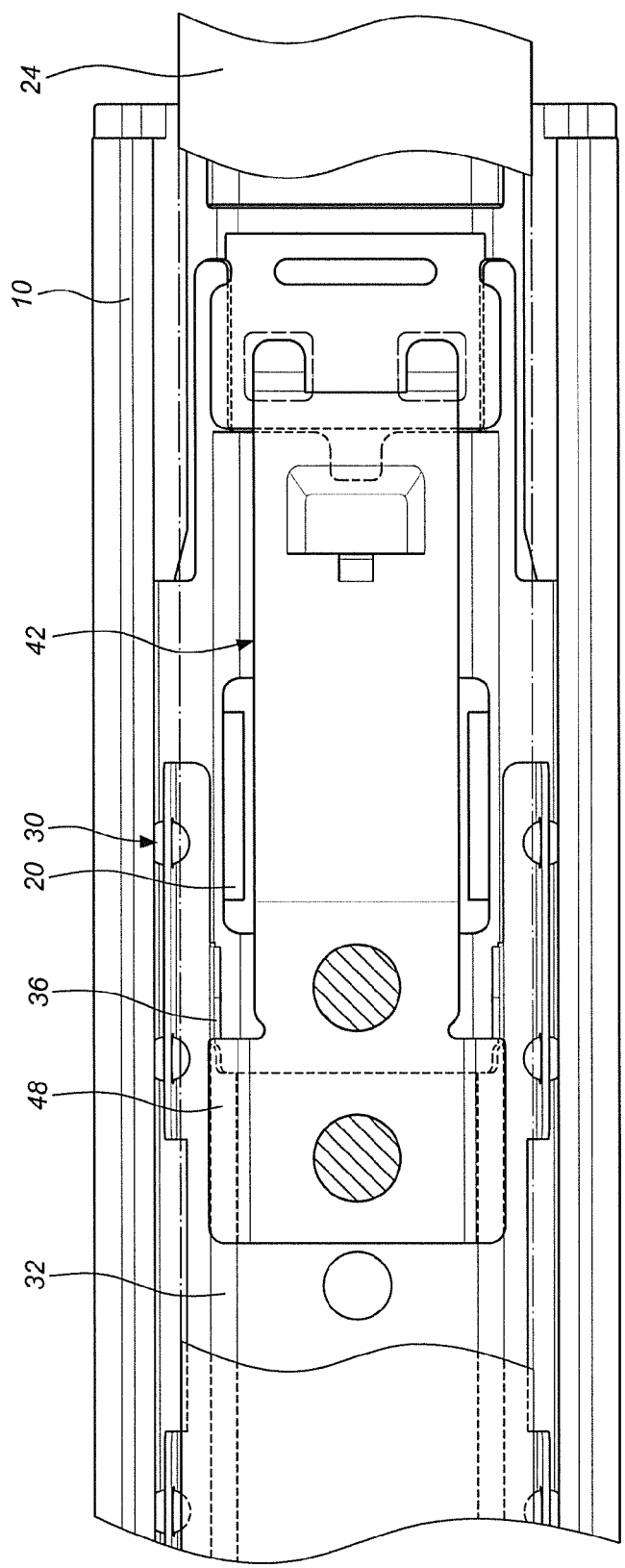
FIG. 7 shows that when the second rail is pulled relative to the first rail, the bearing retainer is stopped by the engaging member and co-moved with the second rail.

As shown in FIG. 7, when the second rail 24 is pulled relative to the first rail 10, if the bearing retainer 32 of the bearing assembly 30 is not moved with the movement of the second rail 24 relative to the first rail 10 and is moved to a pre-set position, by the contact between the second contact portion 48 of the engaging member 42 and the first contact portion 36 of the bearing retainer 32, the bearing retainer 32 can be moved with the movement of the second rail 24 relative to the first rail 10 and is continuously pulled.

As shown in FIGS. 8 and 9, when the second rail 24 is further pulled relative to the first rail 10 and moved to a desired position, the second contact portion 48 of the engaging member 42 contacts the stop wall 20 of the first rail 10, so that the second rail 24 is not drop from the first rail 10. In the meanwhile, the first contact portion 36 of the bearing retainer 32 is moved by the second contact portion 48 of the engaging member 42 so that the first contact portion 36 of the bearing retainer 32 is moved to the stop wall 20 of the first rail 10. Besides, the engaging portion 50 of the engaging member 42 is released by the force of the resilient portion 46 so that the contact end 52 is located corresponding to the stop face 16 of the first rail 10. As shown in FIGS. 8 and 10, when the second contact portion 48 of the engaging member 42 contacts the stop wall 20 of the first rail 10, the contact end 52 of the engaging portion 50 is located at a small distance from the stop face 16 to ensure that the contact end 52 will first move over the stop face 16. And the second rail 24 is retracted a small distance relative to the first rail 10, the contact end 52 of the engaging portion 50 contacts the stop face 16 again. Therefore, the second rail 24 cannot be retracted relative to the first rail 10. When the contact end 52 of the engaging portion 50 contacts the stop face 16, the second inclined guiding portion 56 extends through the recess 18 of the first rail 10 while the contact between the contact end 52 and the stop face 16 is not affected.

When releasing the contact end 52 from the stop face 16, as shown in FIG. 11, the user presses the pressing member 22 by a finger, the pressing member 22 pushes the engaging portion 50 of the engaging member 42, so that the contact end 52 of the engaging portion 50 is disengaged from the stop face 16 of the first rail 10. The third inclined guiding portion 58 can be inserted into the through hole 26 of the second rail 24 to release the engaging member 42 and the second rail 24. The second rail 24 is able to be retracted into the path 12 of the first rail 10.

Figure 12:
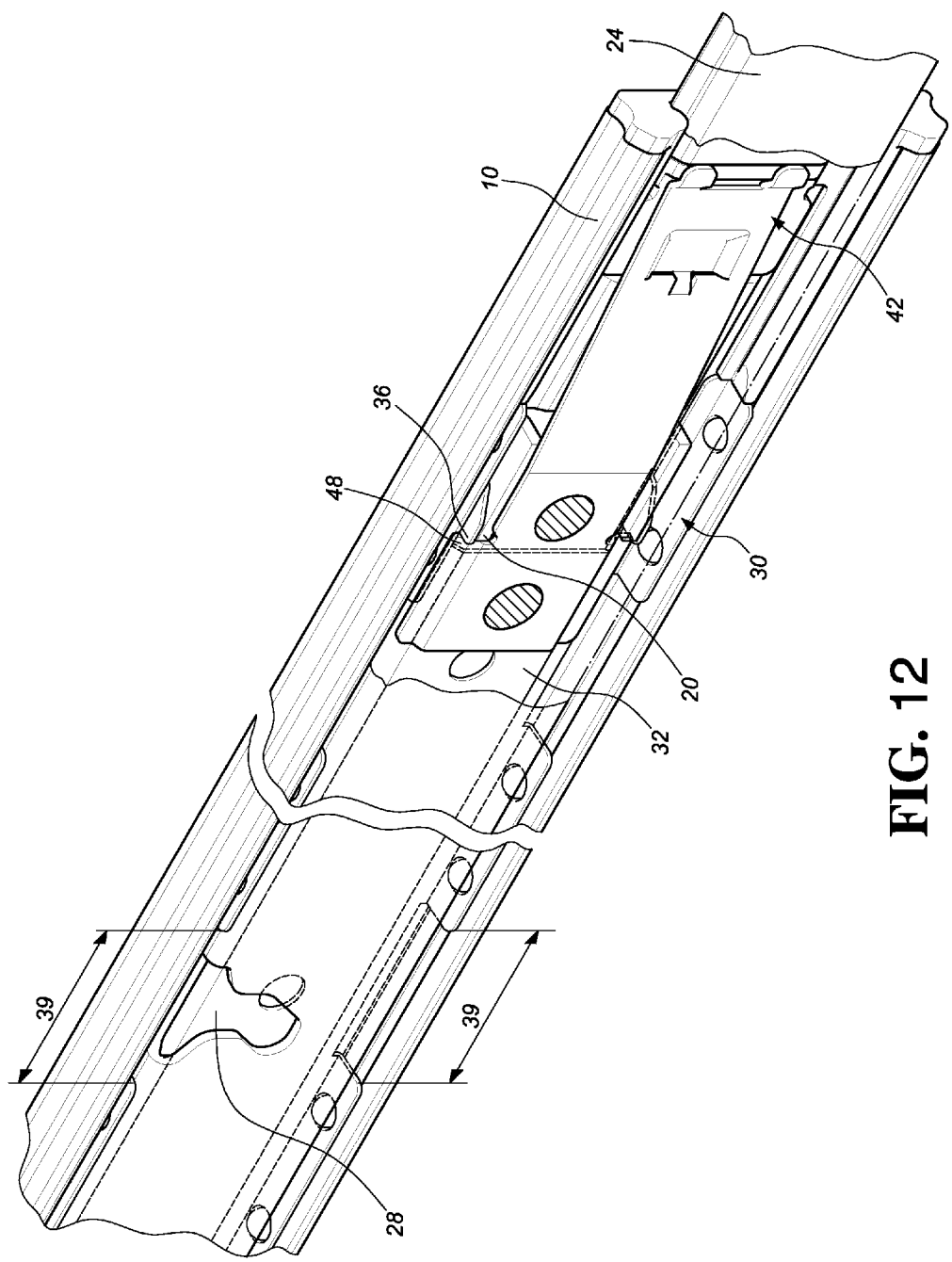
FIG. 12 shows that when the second rail is pulled to a desired position relative to the first rail, one of the notches of the bearing retainer is located corresponding to one of the installation holes of the second rail.

It is noted that as shown in FIG. 12, the pre-set position of the bearing retainer 32 of the bearing assembly 30 is that when the first contact portion 36 of the bearing retainer 32 moves to the stop wall 20 of the first rail 10 to let one of the notches 39 of the bearing retainer 32 be located corresponding to one of the installation holes 28 of the second rail 24. Therefore, by the contact between the second contact portion 48 of the engaging member 42 and the first contact portion 36 of the bearing retainer 32, the bearing retainer 32 is moved with the second rail 24 and moved to the above-mentioned pre-set position. Therefore, when mounting members of the exterior object are connected to the installation holes 28, the bearing retainer 32 does not interfere with the installation.

While we have shown and described the embodiment in accordance with the present invention, it should be clear to those skilled in the art that further embodiments may be made without departing from the scope of the present invention.

What is claimed is:

1. A slide assembly comprising:
a first rail including a path defined along a longitudinal direction of the first rail, an opening located adjacent to an end of the first rail and a stop face defined on a wall of the opening, and a stop wall located adjacent to the opening;
a second rail movably located in the path of the first rail and extendable through the end with the opening, the second rail including multiple installation holes;
a bearing assembly located between the first and second rails, the bearing assembly having a bearing retainer having a first contact portion and having formed therein multiple spaced notches;
a stop base located between the first and second rails, the stop base located adjacent to the opening of the first rail and corresponding to the bearing assembly; and
an engaging member having a fixing portion, a resilient portion, a second contact portion and an engaging portion, the fixing portion fixed to the second rail, the resilient portion extending longitudinally from the fixing portion and being bent at an angle relative to the fixing portion, the second contact portion extending transversely from the fixing portion and located corresponding to the first contact portion of the bearing retainer, the engaging portion extending from the resilient portion and moving toward the first rail by the resilient portion;
wherein when the second rail is pulled in a forward direction relative to the first rail, the bearing retainer is moved with the second rail by engagement between the first contact portion and the second contact portion, the second contact portion engaging both the stop wall and the first contact portion when the second rail is in a desired position to stop further displacement of the second rail in the forward direction relative to the first rail;
the engaging portion of the engaging member being resiliently biased to engage the stop face of the first rail when the second rail moves to the desired position, the engaging member thereby releasably locking both the second rail and the bearing retainer against displacement in a reverse direction relative to the first rail; and
wherein when the second contact portion of the engaging member contacts the stop wall, one of the multiple installation holes is aligned with one of the multiple notches.

2. The slide assembly as claimed in claim 1, wherein the engaging portion of the engaging member protrudes toward the first rail and includes a contact end and a first inclined guiding portion, the contact end faces the fixing portion and the first inclined guiding portion located opposite to the contact end, a second inclined guiding portion extends from the contact end and reaches the resilient portion, the stop face of the first rail has a recess which communicates with the opening and the second inclined guiding portion is inserted into the recess.

3. The slide assembly as claimed in claim 1, wherein the engaging member has a third inclined guiding portion which extends from the resilient portion and bends toward the second rail.

4. The slide assembly as claimed in claim 3, wherein the second rail has a through hole which is located corresponding to the third inclined guiding portion.

5. The slide assembly as claimed in claim 1, further comprising a pressing member engaged with the opening of the first rail, wherein the pressing member is pushed to contact the engaging member so as to move the engaging portion away from the stop face of the first rail.

6. The slide assembly as claimed in claim 5, wherein the pressing member is connected to the stop base.

7. The slide assembly as claimed in claim 5, wherein the pressing member has two wings which contact an inside wall of the opening.

8. A slide assembly comprising:
   a first rail including a path defined along a longitudinal direction of the first rail, an opening located adjacent to an end of the first rail and a stop wall located adjacent to the opening;
   a second rail movably located in the path of the first rail and extendable through the end with the opening, the second rail including multiple installation holes;
   a bearing assembly located between the first and second rails, the bearing assembly having a bearing retainer having a first contact portion and having formed therein multiple spaced notches;
   a stop base located between the first and second rails, the stop base located adjacent to the opening of the first rail and corresponding to the bearing assembly; and
   an engaging member having a fixing portion and a second contact portion, the fixing portion fixed to the second rail, the second contact portion extends transversely from the fixing portion and located corresponding to the first contact portion of the bearing retainer;
   wherein when the second rail is pulled in a forward direction relative to the first rail, the second contact portion of the engaging member engages the first contact portion to displace the bearing retainer toward the stop wall with the second rail, when the second rail is in a desired position, the second contact portion of the engaging member engages both the stop wall of the first rail and the first contact portion to stop further displacement of the second rail in the forward direction relative to the first rail, the engaging member being resiliently biased to engage a portion of the first rail, the engaging member thereby releasably locking both the second rail and the bearing retainer against displacement in a reverse direction relative to the first rail, wherein one of the multiple installation holes is aligned with one of the multiple notches.

* * * * *